United States Patent [19]

Kibler

[11] 4,151,463
[45] Apr. 24, 1979

[54] PHASE LOCKED LOOP INDICATOR
[75] Inventor: Lynden U. Kibler, Middletown, N.J.
[73] Assignee: Bell Telephone Laboratories, Incorporated, Murray Hill, N.J.
[21] Appl. No.: 874,507
[22] Filed: Feb. 2, 1978
[51] Int. Cl.² .......................................... G01R 23/00
[52] U.S. Cl. ..................................... 324/82; 331/25; 331/64
[58] Field of Search ................. 324/82, 83 D, 83 FE; 331/1 R, 14, 18, 15, 25, 64

[56] References Cited
U.S. PATENT DOCUMENTS

| | | | |
|---|---|---|---|
| 3,521,182 | 7/1970 | Stueck | 331/14 |
| 3,961,282 | 6/1976 | Chen | 331/1 R |
| 3,982,190 | 9/1976 | Schaefer | 324/83 D |

Primary Examiner—M. Tokar
Attorney, Agent, or Firm—Erwin w. Pfeifle

[57] ABSTRACT

The present invention relates to an indicator arrangement for indicating the condition of a phase locked loop. The indicator comprises a flip-flop having its two input terminals connected directly to the input terminals of the phase detector of the phase locked loop in a manner such that under a lock condition the signal at the first input terminal of the flip-flop will be advanced in phase from the signal at the second input terminal. Under such condition a first output signal will be generated at a first output terminal of the flip-flop to activate a "lock" indicating device. When out of lock, the signal at the second input terminal of the flip-flop will be advanced in phase to the signal at the first input terminal and (a) a second output signal will be generated at the first output terminal causing deactivation of the indicating device, and (b) a first output signal will be generated at a second output terminal to activate a no-lock indicating device when desired. Additionally, when the phase locked loop is in a capture process, the flip-flop and the connected indicating device will be caused to oscillate and cyclically switch between the lock and no-lock condition indication.

4 Claims, 4 Drawing Figures

LOCK CONDITION SIGNALS

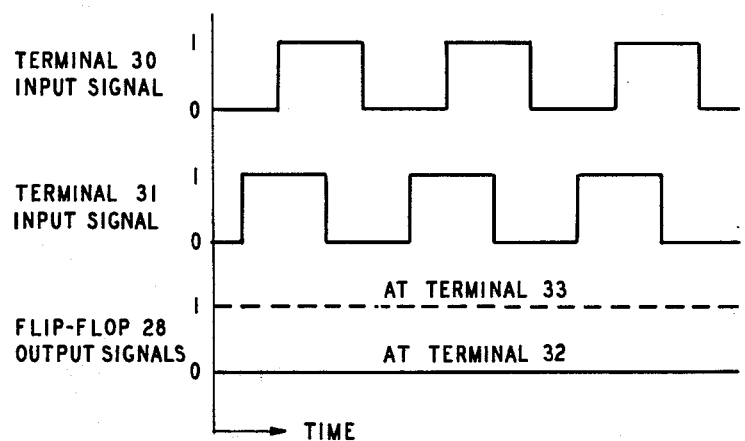
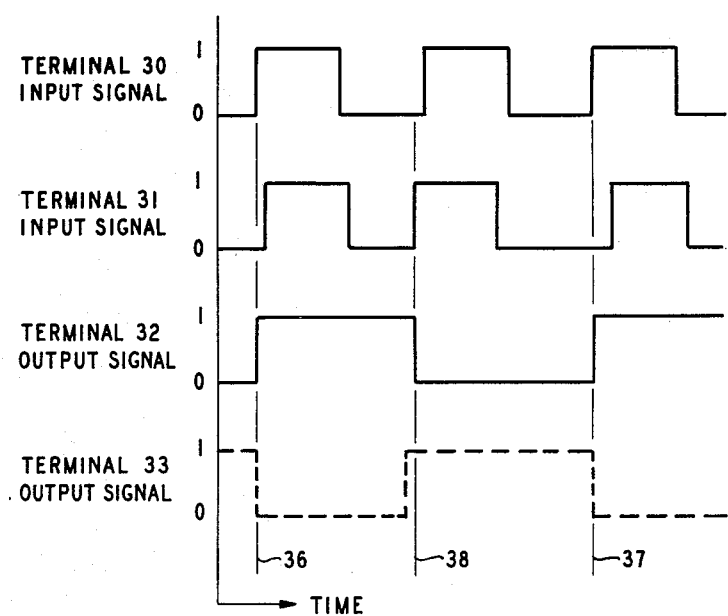

PHASE LOCKED LOOP INDICATOR

Background of the Invention

1. Field of the Invention

The present invention relates to an indicator arrangement capable of indicating the condition of a phase locked loop circuit and, more particularly, to an indicator arrangement comprising a flip-flop having its two input terminals directly connected in a predetermined manner to the input terminals to the phase detector of the phase locked loop circuit such that the flip-flop will activate and deactivate an indicator connected to its output terminal when the phase locked loop is in the locked and unlocked condition, respectively.

2. Description of the Prior Art

Phase locked loop circuits are used in many digital circuits such as, for example, multiplexers and demultiplexers and often there is a need for an indicator to show the condition of the phase locked loop, that is, whether locked or unlocked. Typical prior art arrangements are disclosed in U.S. Pat. Nos. 3,577,178 issued to O. D. Hawley on May 4, 1971 and 3,992,602 issued to R. E. Lunquist on Nov. 25, 1975 and the article "How Can You Be Sure That Your PLL is Really Locked In?" by C. A. Sharpe in EDN, Feb. 20, 1977, Vol. 22, No. 4, at pp. 109–111.

More particularly, in a typical arrangement as shown in the Hawley patent cited hereinabove, a phase locked loop indicator is disclosed for plural phase locked loops which indicates whether each of the plural phase locked loops is locked onto their respective incoming signals or not. In the Hawley arrangement, the output of a single in-phase detector, which is time-shared by the several loops, is fed to a reset integrator, then a level detector, and to the set-reset terminals of a plurality of flip-flops. The flip-flops are sequentially clocked by respective timing signals corresponding to the occurrence of the incoming signals associated with their particular loop. The output state of each flip-flop drives an indicator lamp circuit to show the desired locked or not-locked condition.

The problem in the prior art is to provide a simple and inexpensive phase locked loop indicator which can be arranged to indicate any combination of lock, no-lock, or a capture condition existing in the monitored phase locked loop.

Summary of the Invention

The present invention solves the hereinbefore mentioned problem in the prior art and relates to a simple and inexpensive indicator arrangement capable of indicating whether a phase locked loop circuit is in a locked or unlocked state.

It is another aspect of the present invention to provide a simple and inexpensive indicator arrangement capable of indicating whether a phase locked loop circuit is in the locked, unlocked or capture process state.

The foregoing aspects are achieved by an indicator arrangement comprising a flip-flop having its two input terminals directly connected in a predetermined manner to the input terminals of the phase detector of a phase locked loop circuit such that the flip-flop will activate and deactivate an indicator, such as a lamp, connected to one of the flip-flop output terminals to indicate a locked or unlocked condition, respectively, in the phase locked loop dependent on the phase relationships between the two input signals. By connecting a second indicator to a second one of the flip-flop output terminals, the second indicator will be activated when the first indicator is deactivated to give a visual indication of an unlocked condition in the phase locked loop circuit and, in addition, when the phase locked loop is in the capture process, the indicators will be caused to cyclically switch between the lock and no-lock condition.

Other and further aspects of the present invention will become apparent during the course of the following description and by reference to the accompanying drawings.

Brief Description of the Drawings

Referring now to the drawings, in which like numerals represent like parts in the several views:

FIG. 3 illustrates typical waveforms at the input and output terminals of the flip-flop of the present indicator for an unlocked condition in the phase locked loop circuit; and FIG. 4 illustrates typical waveforms at the input and output terminals of the flip-flop of the present indicator for a capture process occurring in the phase locked loop circuit.

Detailed Description

Figure 1:
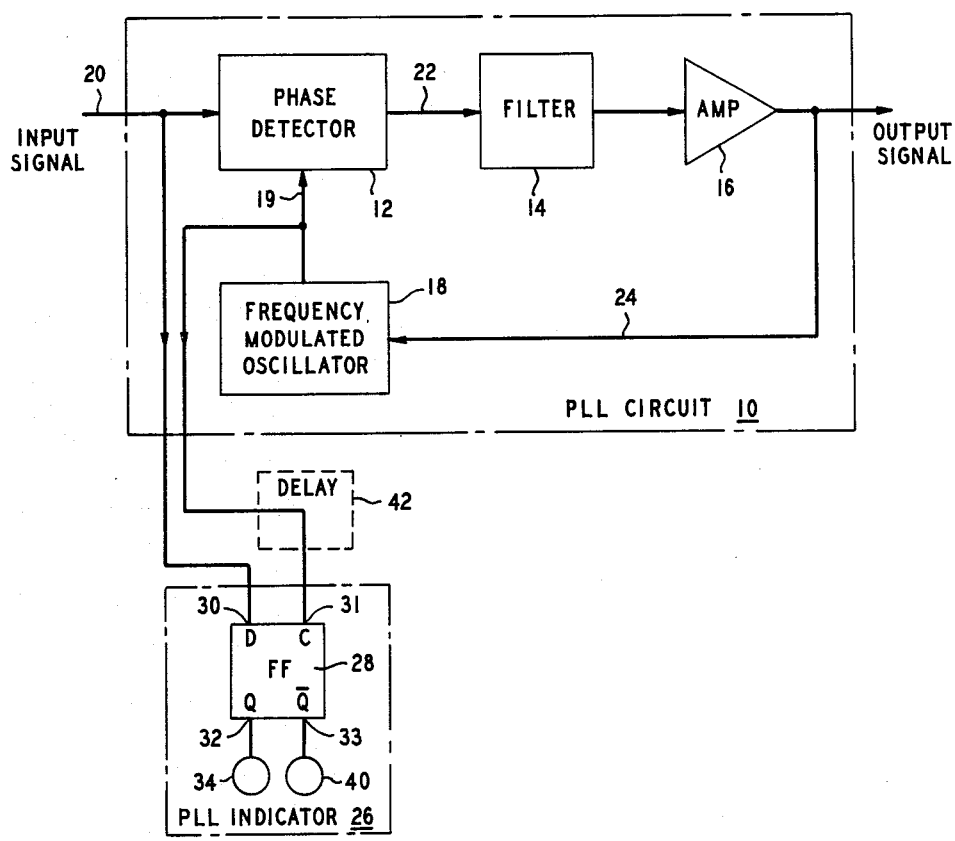
FIG. 1 is a block diagram of a typical prior art phase locked loop circuit and the indicator arrangement according to the present invention connected thereto.

Phase locked loop (PLL) circuits are well known in the art and have been discussed in various publications such as, for example, *Phase-Locked Loops* by A. Blanchard, New York, Wiley and Sons, 1976 and *Phaselock Techniques* by F. M. Gardner, New York, Wiley and Sons, 1966. As shown in FIG. 1, a typical PLL circuit 10 comprises a phase detector 12, a filter 14, an amplifier 16 and a frequency modulated oscillator 18 which can take the form of a voltage-controlled oscillator.

In PLL circuit 10, oscillator 18 is arranged to operate at a predetermined free-running frequency by properly adjusting the parameters thereof, as is well known by those skilled in the art. The output signal from oscillator 18 on lead 19 forms one input to phase detector 12, the second input to phase detector 12 being derived from outside PLL circuit 10 on lead 20. Phase detector 12 functions to compare the frequency of the two input signals on leads 19 and 20 and to generate an output error signal on lead 22 which relates to the amount of phase difference detected away from a predetermined value. The output error signal from phase detector 12 generally comprises an upper and a lower sideband of the modulated two input signals and this error signal is filtered by filter 14, to generally pass the lower sideband thereof, amplified by amplifier 16, when amplication is necessary, and fed back to oscillator 18 on lead 24 to form a control signal for varying the frequency of oscillator 18 in the direction to reduce the error signal or voltage from phase detector 12.

More particularly, on initial turn-on of PLL circuit 10, the initial frequency difference between the two input signals on lead 19 and 20 may be such that the sidebands of the output signal of phase detector 12 on lead 22 may lie outside the passband of filter 14. Under such condition, osciallator 18 continues running at its free-running frequency until the frequency of the input signal on lead 20 varies sufficiently to cause phase detector 12 to generate an output error signal which has a sideband that falls within the passband of filter 14. The occurrence of this filtered error signal initiates a complex capture process for locking oscillator 18 to the input signal on lead 20. As is well known in the art, the range of frequencies in which this capture process taken place is centered about the free-running frequency of oscillator 18 over which the PLL circuit 10 can acquire the locked condition with the input signal on lead 20, and is defined as the "capture frequency range".

It is also well known to those skilled in the art that once the locked condition has been achieved, the PLL circuit 10 can track the input signal on lead 20 over a particular frequency range which is also centered about the free-running frequency of oscillator 18. This frequency range is also known as the "lock frequency range" and when the frequency deviates outside the lock range, PLL circuit 10 is either in the capture process or in unlocked. It is to be understood that phase detector 12 can be of the type which produces a zero error voltage for the locked condition when the two input signals on leads 19 and 20 are either in phase or at quadrature.

The phase locked loop indicator 26 in accordance with the present invention is designed to operate with a phase detector 12 which requires that the input signal on lead 20 be at phase quadrature with the input signal on lead 19 from osciallator 18. However, as will become evident, the present indicator can operate with a phase detector 18 which requires the two input signals to be in phase for lock by introducing an appropriate phase delay 42 between PLL circuit 10 and PLL indicator 26 to obtain the quadrature phase relationship.

Figure 2:
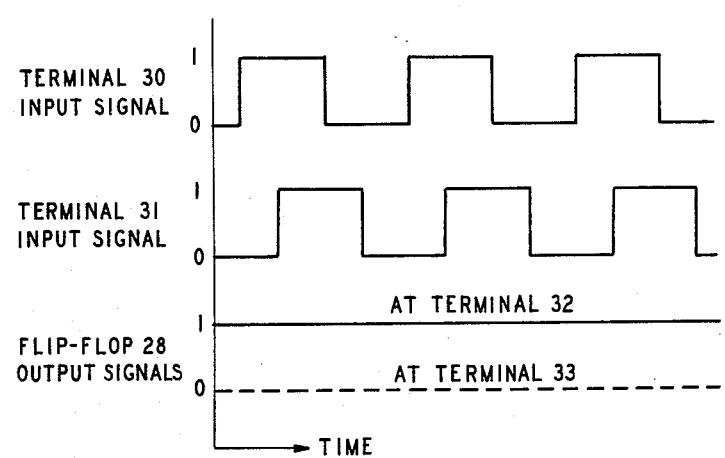
FIG. 2 illustrates typical waveforms at the input and output terminals of the flip-flop of the present indicator for a lock condition in the phase locked loop circuit.

As shown in FIG. 1, the present PLL indicator 26 comprises (a) a flip-flop 28 comprising a first and a second input terminal 30 and 31 directly connected to the input leads 20 and 19, respectively, of phase detector 12 and a first and a second output terminal 32 and 33, and (b) a first indicating device 34 connected to output terminal 32 of flip-flop 28. It is to be understood that flip-flop 28 can be of any suitable type which is wired similar to the commercially available D-type flip-flop, which operates to assume each of the two possible states dependent upon which of the two separate input signals, at input terminals 30 and 31, makes the initial positive transition (from 0 to 1 as shown in FIGS. 2-4) after both input signals are at a minimum value. Additionally, flip-flop 28 is arranged to generate complementary first outut signals at output terminals 32 and 33 when PLL circuit 10 is in the locked state and complementary second output signals, which are opposite to the complementary first output signals, at output terminals 32 and 33 when PLL circuit 10 is in the unlocked state. Indicator 34 can comprise any suitable audible or visual indicating device such as, for example, a light emitting diode (LED) which is capable of being activated and deactivated by the complemetary first and second output signals, respectively, generated by flip-flop 28 at its first output terminal 32.

FIG. 2 illustrates typical input and output waveforms for flip-flop 28 for a locked condition in an exemplary PLL circuit 10 which requires phase quadrature between the two input signals to phase detector 12 for lock. Under the locked condition, the input signal on lead 20 will be advanced in phase to the input signal on lead 19 from osciallator 18, and since these signals will be directly applied to input terminals 30 and 31, respectively, of flip-flop 28, the flip-flop will assume its first state and generate a high and a low output signal at first and second output terminals 32 and 33, respectively. The high output signal at output terminal 32 is applied to indicating device 34 to activate that device and show the locked condition.

FIG. 3 illustrates typical input and output waveforms for flip-flop 28 for unlocked condition in the exemplary PLL circuit 10. In the unlocked condition, the input signal on lead 20, and applied to input terminal 30 of flip-flop 28, will be delayed in phase to the input signal on lead 19, and applied to input terminal 31 of flip-flop 28. Such condition will cause flip-flop 28 to assume its second state and generate a low and a high output signal at first and second output terminals 32 and 33, respectively. The low output signal at output terminal 32 causes indicating device 34 to be deactivated to show the unlocked condition.

FIG. 4 illustrates typical input and output waveforms for flip-flop 28 where the exemplary PLL circuit 10 is in the capture process. During the capture process, the input signals on leads 19 and 20 are generally found to shift in phase in a manner where first one input signal is advanced in phase to the second input signal and then the second input signal is advanced in phase to the first input signal as PLL circuit 10 attempts to achieve the locked condition. As shown typically in FIG. 4, at time periods 36 and 37 the input pulse to terminal 30 of flip-flop 28 is advanced in phase to the pulse applied to input terminal 31 and, therefore, a high and a low output signal will be generated at output terminals 32 and 33, respectively, and indicator device 34 will be activated. At time period 38, however, the input pulse to terminal 31 of flip-flop 28 is advanced in phase to the pulse applied to input terminal 30 and a low and a high output signal will be genrated at output terminals 32 and 33, respectively, and indicator device 34 will be deactivated.

From the foregoing discussion it can be seen that the present PLL indicator 26 will indicate (a) a locked condition by an activated indicator device 34. (b) an unlocked condition by a deactivated indicator device 34, and (c) a capture process occurring by cyclically activating and deactivating the indicator device 34.

Since a deactivated indication by indicating device 34 can result from the unlocked state of PLL circuit 10 or an inoperable indicator device 34, the latter condition can be immediately realized by the inclusion of a second indicator device 40 connected to output terminal 33 of flip-flop 28. As can be readily seen from FIGS. 2-4, with the two indicator devices connected as shown in FIG. 1, one of the two devices will be activated at all times and the activation of indicator device 40 can be used to positively show the unlocked condition in PLL circuit 10. It follows that if both indicator devices 34 and 40 are currently in the deactivated state, then one of the two or both indicator devices are defective and the defective device can be replaced.

Where the exemplary PLL circuit 10 is of the type which requires the two signals on leads 19 and 20 to be in phase for lock, the present PLL indicator 26 can be used by inserting a suitable delay circuit 42 in the input lead to input terminal 31 of flip-flop 28, as shown in FIG. 1, to provide the appropriate input signals to flip-flop 28, as shown in FIGS. 2-4, for the various conditions of PLL cirucit 10.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. An indicator arrangement for a phase locked loop circuit, the loop circuit including a phase detector comprising a first and a second input terminal connected to an input terminal of the loop circuit and an output terminal of a frequency modulated oscillator disposed in the feedback path of the loop circuit, respectively, the indicator arrangement comprising:

a flip-flop comprising a first and a second input terminal directly connected to the first and second input terminals, respectively, of the phase detector and an output terminal, said flip-flop being arranged to generate a first output signal at said output terminal when a signal at the first input terminal thereof is advanced in phase to the input signal at the second input terminal thereof and to generate a second output signal, complementary to said first output signal, at said output terminal when a signal at the first input terminal thereof lags in phase to the input signal at the second input terminal thereof; and means, connected to the output terminal of said flip-flop, capable of indicating a locked and an unlocked condition in the phase locked loop circuit by the activation and deactivation, respectively, of said indicating means in response to the generation of said respective first and second output signals.

2. An indicator arrangement according to claim 1 wherein said flip-flop further comprises a second output terminal and said flip-flop is also arranged to generate a third output signal at said second output terminal thereof both complementing to and concurrent with the generation of said first outut signal at said first output terminal and to generate a fourth output signal at said second output terminal thereof both complementary to and concurrent with the generation of said second output signal at said first output terminal; and said indicator arrangement further comprises a second means, connected to said second output terminal of said flip-flop capable of indicating an unlocked and a locked condition in the phase locked loop circuit by the activation and deactivation, respectively, of said second indicating means in response to the generation of said respective third and fourth output signals.

3. An indicator arrangement according to claim 1 wherein said indicating means comprises either on of an audible and visual indicating device capable of being activated and deactivated by said first and second output signals, respectively, generated by said flip-flop.

4. An indicator arrangement according to claim 2 wherein each of said first and second indicating means comprises either one of an audible and visual indicating device capable of being activated by the associated first and fourth output signals generated by said flip-flop and deactivated by the associated second and third output signals generated by said flip-flop.

* * * * *